(12) United States Patent
Lee et al.

(10) Patent No.: US 10,644,097 B2
(45) Date of Patent: May 5, 2020

(54) ORGANIC LIGHT EMITTING DIODE DISPLAY DEVICE

(71) Applicant: LG Display Co., Ltd., Seoul (KR)

(72) Inventors: Joonsuk Lee, Paju-si (KR); Sejune Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/002,884

(22) Filed: Jun. 7, 2018

(65) Prior Publication Data

US 2018/0358425 A1    Dec. 13, 2018

(30) Foreign Application Priority Data

Jun. 9, 2017 (KR) .................. 10-2017-0072647

(51) Int. Cl.
*H01L 27/32*    (2006.01)
*G09G 3/3291*   (2016.01)

(52) U.S. Cl.
CPC ........ *H01L 27/3279* (2013.01); *H01L 27/322* (2013.01); *G09G 3/3291* (2013.01); *G09G 2310/08* (2013.01); *G09G 2320/0673* (2013.01)

(58) Field of Classification Search
CPC ............... H01L 51/56; H01L 51/0097; H01L 2251/5338; H01L 51/5253; H01L 43/12

USPC ........................................................... 257/40
See application file for complete search history.

(56) References Cited

U.S. PATENT DOCUMENTS

| 2015/0034913 | A1* | 2/2015 | Yoon ............ | H01L 51/5203 257/40 |
| 2016/0043343 | A1* | 2/2016 | Zhang .......... | H01L 51/5212 257/40 |
| 2016/0226030 | A1* | 8/2016 | Heo ............. | H01L 27/3269 |

FOREIGN PATENT DOCUMENTS

| KR | 10-2007-0002748 A | 1/2007 |
| KR | 10-2008-0105475 A | 12/2008 |
| KR | 10-2010-0068644 A | 6/2010 |
| KR | 10-2011-0005975 A | 1/2011 |

* cited by examiner

*Primary Examiner* — Andy Huynh
(74) *Attorney, Agent, or Firm* — Seed IP Law Group LLP

(57) ABSTRACT

An organic light emitting diode display device is disclosed. The organic light emitting diode display device includes a first substrate having a plurality of pixels in which a thin film transistor and an organic light emitting diode connected to the thin film transistor are arranged, a second substrate having a power supply wiring to which a power supply voltage is applied, and a conductive filler layer interposed between the first substrate and the second substrate and having a conductive medium. A cathode of the organic light emitting diode and the power supply wiring are electrically connected through the conductive filler layer.

21 Claims, 8 Drawing Sheets

ORGANIC LIGHT EMITTING DIODE DISPLAY DEVICE

This application claims the priority benefit of Korean Patent Application No. 10-2017-0072647 filed on Jun. 9, 2017, the entire contents of which is incorporated herein by reference for all purposes as if fully set forth herein.

BACKGROUND

Technical Field

The present disclosure relates to an organic light emitting diode display device.

Description of the Related Art

Various display devices capable of reducing weight and volume, which are disadvantages of cathode ray tubes, have been developed. The display devices may be implemented as a liquid crystal display (LCD), a field emission display (FED), a plasma display panel (PDP), an electroluminescent display, an organic light emitting diode display device, and the like.

Among these display devices, the organic light emitting diode display device is a self-emission type display device which excites an organic compound to emit light. The organic light emitting diode display device has advantages of being light and thin and simplifying the process because the backlight used in the LCD is not required. In addition, the organic light emitting diode display device is widely used because it has characteristics such as low-temperature production, high response speed as response speed of less than 1 ms, low power consumption, wide viewing angle and high contrast.

The organic light emitting diode display device includes an organic light emitting diode (OLED) for converting electrical energy into light energy. The organic light emitting diode includes an anode, a cathode, and an organic light emitting layer disposed therebetween. In the organic light emitting diode display device, holes and electrons injected from the anode and the cathode, respectively, are combined in the organic light emitting layer to form excitons. The formed excitons emit light while falling from an excited state to a ground state and display an image.

However, a large-area organic light emitting display device cannot maintain a uniform luminance on an entire surface of an active area in which the input image is displayed, so that it generates a luminance deviation depending on a position. More specifically, the cathode constituting the organic light emitting diode is formed so as to cover most of the active area, and there arises a problem that power supply voltage applied to the cathode does not have a uniform voltage value over the entire surface. For example, as a deviation between a voltage value at a lead-in part to which the power supply voltage is applied and a voltage value at a position apart from the lead-in part increases due to a resistance of the cathode, the luminance deviation depending on the position increases.

These problems are more problematic in a top emission type display device. That is, in the top emission type display device, since it is necessary to secure transmittance of the cathode positioned in an upper layer in the organic light emitting diode, the cathode may be formed of a transparent conductive material such as Indium Tin Oxide (ITO), or may be formed of an opaque conductive material having a very thin thickness. In this case, since a surface resistance becomes large, the luminance deviation depending on the position becomes remarkably large correspondingly.

In order to solve such a problem, it has been proposed a method that an Evss wiring including a low-resistance material is formed and connected to the cathode to prevent a voltage drop depending on a position. A connection structure of the Evss wiring and the cathode is shown in Application No. 10-2008-0127071 filed by the present applicant. However, the connection structure of the Evss wiring and the cathode disclosed in the related art has a complicated connection structure and requires additional processes such as forming a partition. Thus, there arise problems that manufacturing cost and manufacturing time increase and manufacturing yield lowers.

Further, in the structure disclosed in the related art, since the Evss wiring is formed on a first substrate, it is necessary to allocate a connecting area of the Evss wiring and the cathode as well as a thin film transistor area and a storage capacitor area in one pixel. Therefore, the structure disclosed in the related art has a problem that it is difficult to apply to a high-resolution display device having a small single pixel size.

BRIEF SUMMARY

The present disclosure provides an organic light emitting diode display device that prevents a voltage drop depending on a position, thereby eliminating the problem of luminance non-uniformity.

In one aspect, there is provided an organic light emitting diode display device including a first substrate having a plurality of pixels in which a thin film transistor and an organic light emitting diode connected to the thin film transistor are arranged, a second substrate having a power supply wiring to which a power supply voltage is applied, and a conductive filler layer interposed between the first substrate and the second substrate and having a conductive medium. A cathode of the organic light emitting diode and the power supply wiring are electrically connected through the conductive filler layer.

The first substrate and the second substrate may include a light emitting area in which the pixels are disposed and a non-light emitting area outside the light emitting area, and the power supply wiring may be disposed in the non-light emitting area.

The second substrate may comprise an auxiliary wiring which is in direct contact with the power supply wiring and the conductive filler layer, respectively, and the auxiliary wiring may include a transparent conductive material.

The auxiliary wiring may have a larger area than the power supply wiring.

The second substrate may further comprise color filters assigned corresponding to each of the pixels, and the color filters may be partitioned by the power supply wiring.

The first substrate may further comprise color filters assigned corresponding to each of the pixels, and the color filters may be disposed on the cathode.

The organic light emitting diode display device may further comprise a link member attached to at least one side of the first substrate. The first substrate may comprise a power supply pad part which is connected to the link member, and receives the power supply voltage through the link member and transmits the power supply voltage to the conductive filler layer.

The power supply pad part may be in direct contact with the cathode.

The organic light emitting diode display device may further comprise a link member attached to at least one side of the second substrate. The second substrate may further comprise a power supply pad part which is connected to the link member and receives the power supply voltage through the link member and transmits the power supply voltage to the power supply wiring.

The power supply pad part may include a pad electrode connected to the link member, and the pad electrode may be in direct contact with the power supply wiring and the conductive filler layer, respectively, and include a transparent conductive material.

The power wiring may include a low reflective material.

The conductive filler layer may comprise of at least one of a conductive poly (3,4-ethylenedioxythiophene) (PEDOT) and an ionic liquid.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
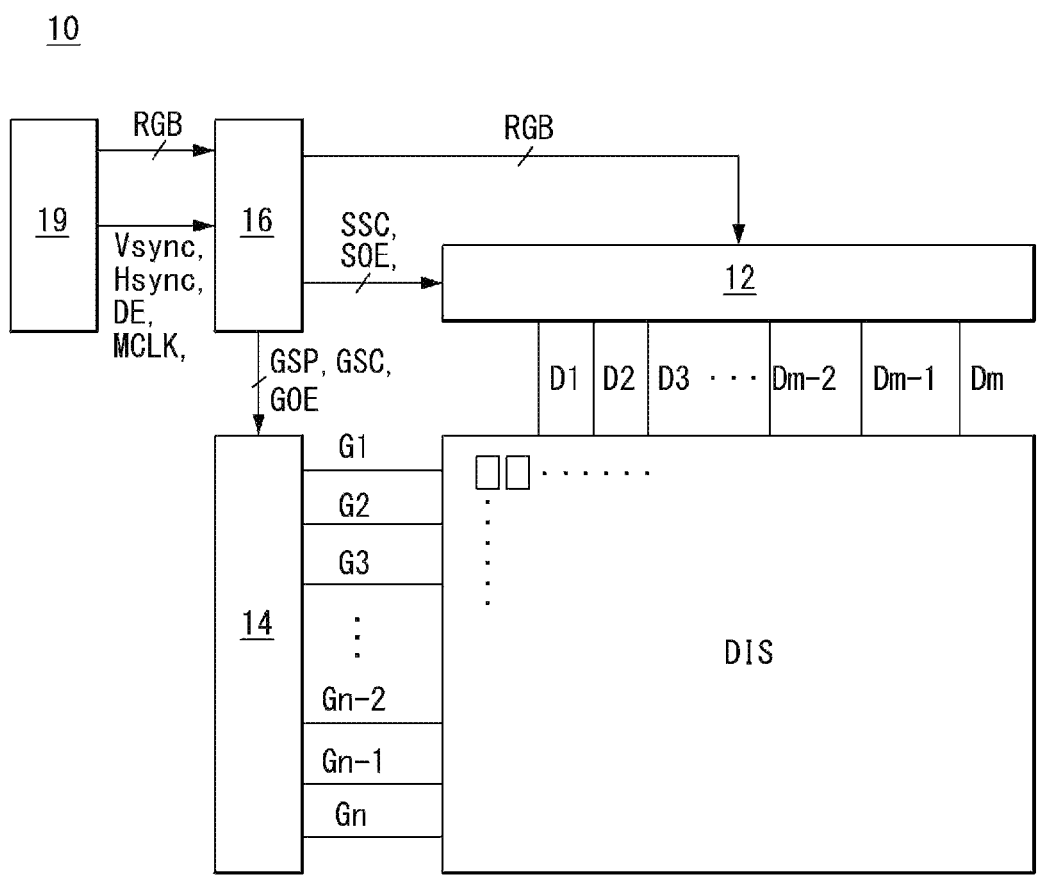
FIG. 1 is a block diagram schematically showing an organic light emitting diode display device.

Hereinafter, preferred embodiments of the present disclosure will be described with reference to the accompanying drawings. Like reference numerals designate like elements throughout the description. In the following description, when a detailed description of well-known functions or configurations related to this document is determined to unnecessarily cloud a gist of the disclosure, the detailed description thereof will be omitted. In describing the various embodiments, the same components may be described at the outset and may be omitted in other embodiments.

The terms "first", "second", etc., may be used to describe various components, but the components are not limited by such terms. These terms are only used to distinguish one component from another component.

Figure 2:
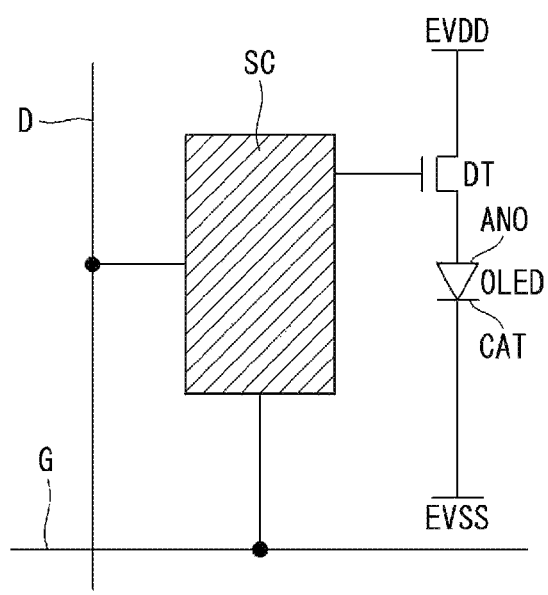
FIG. 2 is a schematic diagram showing a pixel shown in FIG. 1.

FIG. 1 is a block diagram schematically showing an organic light emitting diode display device. FIG. 2 is a schematic diagram showing a pixel shown in FIG. 1.

Referring to FIG. 1, an organic light emitting diode display device 10 according to the present disclosure includes a display driving circuit and a display panel DIS.

The display driving circuit includes a data driver 12, a gate driver 14, and a timing controller 16, and writes a video data voltage of an input image to pixels of the display panel DIS. The data driver 12 converts digital video data RGB input from the timing controller 16 into an analog gamma compensation voltage to generate a data voltage. The data voltage output from the data driver 12 is supplied to data lines D1 to Dm. The gate driver 14 sequentially supplies a gate signal synchronized with the data voltage to gate lines G1 to Gn to select the pixels of the display panel DIS to which the data voltage is written.

The timing controller 16 receives a timing signal such as a vertical synchronizing signal Vsync, a horizontal synchronizing signal Hsync, a data enable signal DE and a main clock MCLK, and the like input from a host system 19, and synchronizes operation timing of the data driver 12 and the gate driver 14. Data timing control signal for controlling the data driver 12 includes a source sampling clock SSC, a source output enable signal SOE, and the like. Gate timing control signal for controlling the gate driver 14 includes a gate start pulse GSP, a gate shift clock GSC, a gate output enable signal GOE, and the like.

The host system 19 may be implemented as any one of a television system, a set-top box, a navigation system, a DVD player, a Blu-ray player, a personal computer (PC), a home theater system, and a phone system. The host system 19 includes a system on chip (SoC) with an embedded scaler to convert the digital video data RGB of the input image into a format suitable for displaying on the display panel DIS. The host system 19 transmits the timing signals Vsync, Hsync, DE, and MCLK together with the digital video data to the timing controller 16.

The display panel DIS includes a pixel array. The pixel array includes pixels defined by the data lines (D1 to Dm, where m is a positive integer) and the gate lines (G1 to Gn, where n is a positive integer). Each of the pixels includes an organic light emitting diode (OLED), which is a self light emitting element.

Referring further to FIG. 2, in the display panel DIS, a plurality of data lines D intersect with a plurality of gate lines G in intersecting areas, and pixels are arranged in a matrix form in each of the intersecting areas. Each of the pixels includes an OLED, a driving thin film transistor (hereinafter, referred to as TFT) DT for controlling an amount of current flowing through the OLED, and a programming unit SC for setting a gate-source voltage of the driving TFT DT. The programming unit SC can be referred to by other names, such as a scan circuit, a data transfer circuit or the like.

The programming unit SC is shown as block for convenience since it mat be comprised of many different circuits and circuit combinations. In one embodiment, SC may include at least one switching TFT and at least one storage capacitor. In other embodiments, it may include two TFTs and one or two capacitors. It still other embodiments, it might include three or more TFTs, including a sense TFT, a reference TFT and other circuits, both passive and active. Thus there are many acceptable circuits that can perform the function of the programming unit SC. The switching TFT is turned on in response to a gate signal from the gate line G to apply a data voltage from the data line D to one electrode of the storage capacitor. The driving TFT DT controls the amount of current supplied to the OLED depending on a magnitude of a voltage charged in the storage capacitor to control an amount of light emitted from the OLED. The amount of light emitted from the OLED is proportional to the amount of current supplied from the driving TFT DT. Each of the pixels is connected to a high level power source EVDD and a low level power source EVSS, and are supplied with a high level power supply voltage and a low level power supply voltage from a power generator (not shown). TFTs constituting a pixel may be implemented as a p-type or an n-type. In addition, a semiconductor layer of the TFTs constituting the pixel may include amorphous silicon, polysilicon, or an oxide. Hereinafter, a case where the semiconductor layer includes the oxide will be described as an example. The OLED includes an anode electrode ANO, a cathode electrode CAT, and an organic compound layer interposed between the anode electrode ANO and the cathode electrode CAT. The anode electrode ANO is connected to the driving TFT DT.

First Embodiment

Figure 3:
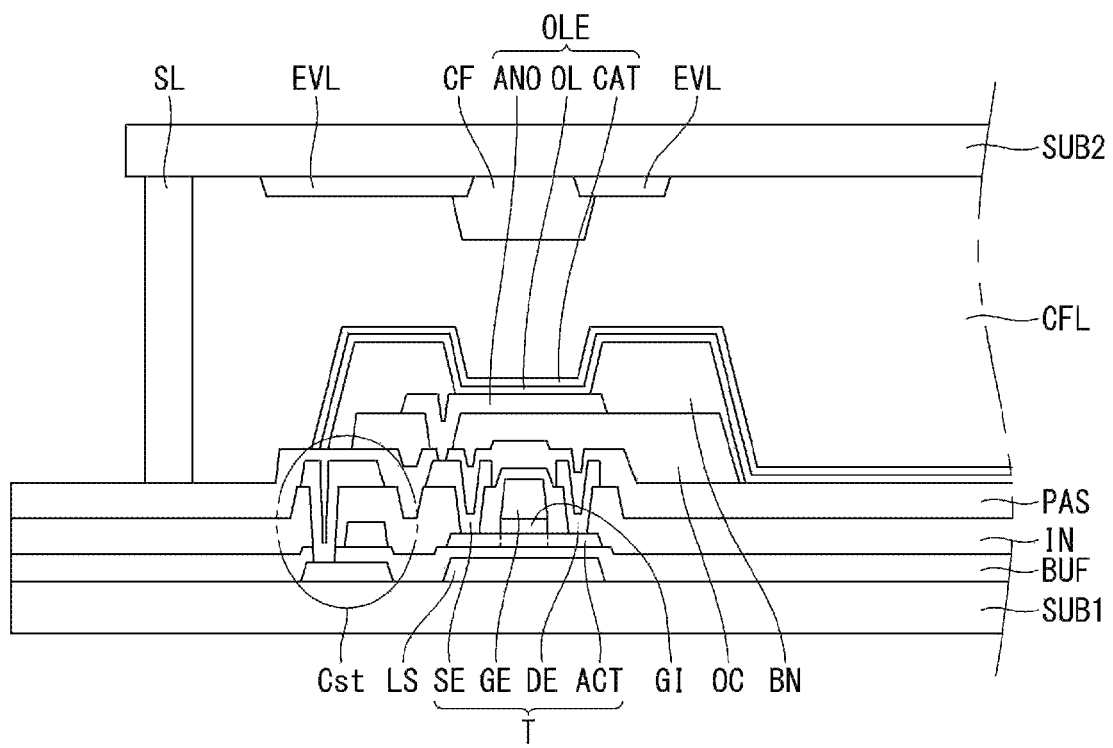
FIG. 3 is a cross-sectional view illustrating an organic light emitting diode display device according to a first embodiment of the present disclosure.

FIG. 3 is a cross-sectional view illustrating an organic light emitting diode display device according to a first embodiment of the present disclosure.

Referring to FIG. 3, an organic light emitting diode display device according to a first embodiment of the present disclosure includes a display panel having a first substrate SUB1 and a second substrate SUB2 facing each other and a conductive filler layer CFL interposed between the first substrate SUB1 and the second substrate SUB2. The first substrate SUB1 is a thin film transistor array substrate having a plurality of pixels in which a thin film transistor T and an organic light emitting diode OLE are arranged. The second substrate SUB2 is a substrate on which an Evss wiring EVL (or a low voltage level power wiring) is formed. The second substrate SUB2 can function as an encapsulation substrate. The first substrate SUB1 and the second substrate SUB2 may be bonded together through a sealant SL. The sealant SL may be disposed at edges of the first substrate SUB1 and the second substrate SUB2 to maintain a predetermined bonding distance.

The first substrate SUB1 may be made of glass or a plastic material. For example, the first substrate SUB1 may be formed of a plastic material such as polyimide (PI), polyethylene terephthalate (PET), polyethylene naphthalate (PEN), polycarbonate (PC) or the like to have a flexible characteristic.

The thin film transistor T and the organic light emitting diode OLE connected to the thin film transistor T are formed on the first substrate SUB1. A light shielding layer LS and a buffer layer BUF may be formed between the first substrate SUB1 and the thin film transistor T. The light shielding layer LS is disposed to overlap with a semiconductor layer, particularly a channel, of the thin film transistor T and protects an oxide semiconductor element from external light. The buffer layer BUF functions to block ions or impurities diffused from the first substrate SUB1 and to block moisture penetration from the outside.

The thin film transistor T includes a semiconductor layer ACT, a gate electrode GE, and source/drain electrodes SE and DE.

A gate insulating layer GI and the gate electrode GE are disposed on the semiconductor layer ACT. The gate insulating layer GI insulates the gate electrode GE and may be formed of a silicon oxide film (SiOx), but is not limited thereto. The gate electrode GE is disposed so as to overlap with the semiconductor layer ACT with the gate insulating layer GI interposed therebetween. The gate electrode GE may be formed of any one selected from a group consisting of copper (Cu), molybdenum (Mo), aluminum (Al), chromium (Cr), gold (Au), titanium (Ti), nickel (Ni), neodymium (Nd), tantalum (Ta) and tungsten (W) or may be formed of a single layer or a multilayer of an alloy thereof. The gate insulating layer GI and the gate electrode GE may be patterned using the same mask. In this case, the gate insulating layer GI and the gate electrode GE may have the same area. Although not shown, the gate insulating layer GI may be formed so as to cover an entire surface of the first substrate SUB1.

An interlayer insulating layer IN is disposed on the gate electrode GE. The interlayer insulating layer IN insulates the gate electrode GE and the source/drain electrodes SE and DE from each other, and may be formed of a silicon oxide film (SiOx), a silicon nitride film (SiNx), or a multilayer thereof. The interlayer insulating layer IN is not limited thereto.

The source/drain electrodes SE and DE are disposed on the interlayer insulating layer IN. The source electrode SE and the drain electrode DE are spaced apart from each other by a predetermined distance. The source electrode SE is in contact with one side of the semiconductor layer ACT through a source contact hole passing through the interlayer insulating layer IN. The drain electrode DE is in contact with other side of the semiconductor layer ACT through a drain contact hole passing through the interlayer insulating layer IN.

The source electrode SE and the drain electrode DE may be formed of a single layer or a multilayer. In a case of a single layer, the source electrode SE and the drain electrode DE may be formed of any one selected from a group consisting of molybdenum (Mo), aluminum (Al), chromium (Cr), gold (Au), titanium (Ti), nickel (Ni), neodymium (Nd), and copper (Cu) or may be formed of an alloy thereof. When the source electrode SE and the drain electrode DE are multilayered, the source electrode SE and the drain electrode DE may be formed of a double layer of molybdenum/aluminum-neodymium, molybdenum/aluminum, titanium/aluminum, or copper/molytitanium (MoTi) or a triple layer of molybdenum/aluminum-neodymium/molybdenum, molybdenum/aluminum/molybdenum, titanium/aluminum/titanium or molytitanium/copper/molytitanium.

A passivation layer PAS is disposed on the thin film transistor T. The passivation layer PAS protects the thin film transistor T and may be made of silicon oxide (SiOx), silicon nitride (SiNx) or a multilayer thereof.

A planarization layer OC is disposed on the passivation layer PAS. The planarization layer OC flattens a lower stepped portion, and may be formed of organic materials such as photo acryl, polyimide, benzocyclobutene resin, and acrylate resin. Either one of the passivation layer PAS and the planarization layer OC may be omitted, if necessary.

The organic light emitting diode OLE is disposed on the planarization layer OC. The organic light emitting diode OLE includes an anode ANO, an organic light emitting layer OL, and a cathode CAT. More specifically, the anode ANO is disposed on the planarization layer OC. The anode ANO is connected to the source electrode SE of the thin film transistor T through a contact hole passing through the passivation layer PAS and the planarization layer OC. The anode ANO may function as a reflective electrode including a reflective layer. The reflective layer may be made of aluminum (Al), copper (Cu), silver (Ag), nickel (Ni) or an alloy thereof, preferably silver/palladium/copper alloy (APC). The anode ANO may be composed of a multilayer including the reflective layer.

A bank layer BN for partitioning the pixels is positioned on the first substrate SUB1 on which the anode ANO is formed. The bank layer BN may be formed of an organic material such as polyimide, benzocyclobutene series resin, or acrylate. A central part of the anode ANO exposed by the bank layer BN may be defined as a light emitting area. The bank layer BN is disposed so as to cover a side of the anode ANO while exposing the central part of the anode ANO.

The bank layer BN and the planarization layer OC may be patterned so as to cover only the thin film transistor T and a storage capacitor Cst connected thereto in the pixel. The storage capacitor Cst may be formed of a triple structure in which first to third capacitor electrodes are overlapped as shown, and may be implemented as various multi-layers as required.

The organic light emitting layer OL is positioned on the anode ANO exposed by the bank layer BN. The organic light emitting layer OL may be formed on the entire surface of the first substrate SUB1. The organic light emitting layer OL is a layer in which electrons and holes are combined to emit light, and may include a light emission layer (EML), and further include at least one of a hole injection layer (HIL), a hole transport layer (HTL), an electron transport layer (ETL), and an electron injection layer (EIL). The light emission layer may include a light emitting material that generates white light.

The cathode CAT is positioned on the organic light emitting layer OL. The cathode CAT may be formed widely on the entire surface of the first substrate SUB1. The cathode CAT may be formed of a transparent conductive material such as Indium Tin Oxide (ITO) and Indium Zinc Oxide (IZO), and made of magnesium (Mg), calcium (Ca), aluminum (Al), silver (Ag), or an alloy thereof having a thickness so thin that light can be transmitted.

The Evss wiring EVL and a color filter CF are formed on the second substrate SUB2. A stacking order of the Evss wiring EVL and the color filter CF may be changed on the second substrate SUB2. That is, the color filter CF may be formed after the Evss wiring EVL is formed, or the Evss wiring EVL may be formed after the color filter CF is formed.

The Evss wiring EVL includes a low-resistance conductive material. For example, the Evss wiring EVL may be made of any one selected from a group consisting of molybdenum (Mo), aluminum (Al), chromium (Cr), gold (Au), titanium (Ti), nickel (Ni), neodymium (Nd) and copper (Cu) or may be made of alloys thereof.

The Evss wiring EVL may include a low-reflection conductive material. For example, since the Evss wiring EVL is formed of the low-reflection conductive material, it is possible to prevent visibility from being deteriorated due to reflection of external light. Therefore, the display device according to the preferred embodiment of the present disclosure does not need to have separate means for shielding (or absorbing) light incident from outside like a polarizing film.

The Evss wiring EVL may function as a black matrix. Therefore, the Evss wiring EVL can prevent occurrence of color mixture defects between neighboring pixels. The Evss wiring EVL may be disposed in a non-light emitting area so as to permit more area to be available for the light emitting area.

The color filter CF may include red (R), blue (B), and green (G) color filters. The pixel may include sub-pixels emitting red (R), blue (B) and green (G), and the color filter CF may be assigned to each of the corresponding sub-pixels. The red (R), blue (B) and green (G) color filters CF may be partitioned by the Evss wiring EVL. If necessary, the pixel may further include a white (W) sub-pixel.

A conductive filler layer CFL is interposed between the first substrate SUB1 and the second substrate SUB2. The cathode CAT of the first substrate SUB1 and the Evss wiring EVL of the second substrate SUB2 are electrically connected through the conductive filler layer CFL. Therefore, a low level power supply voltage is applied to both the cathode CAT and the Evss wiring EVL. The conductive filler layer CFL may be formed by dispersing conductive fillers in a solvent, and may be composed of a conductive solvent. For example, the conductive filler layer CFL may comprise at least one of a conductive polymer poly (3,4-ethylenedioxythiophene) (PEDOT) and an ionic liquid, but is not limited thereto.

A bonding distance between the first substrate SUB1 and the second substrate SUB2 may be appropriately selected depending on viscosity of the conductive filler layer CFL. Since the present disclosure uses the conductive filler having low viscosity compared to a non-conductive filler, the bonding distance between the first substrate SUB1 and the second substrate SUB2 can be reduced. Accordingly, the present disclosure has an advantage that a wide viewing angle and a high aperture ratio can be secured.

In the first embodiment of the present disclosure, since voltage deviation depending on a position can be reduced by connecting the Evss wiring EVL formed of a low-resistance conductive material to the cathode CAT, it is possible to reduce non-uniformity in luminance.

Since the first embodiment of the present disclosure does not require additional structures (for example, partition walls) as in the prior art in order to connect the low-resistance Evss wiring EVL to the cathode CAT, there is no need to perform a separate additional process. Further, since the Evss wiring EVL according to the first embodiment of the present disclosure functions as a black matrix in the second substrate SUB2, there is no need to perform a separate additional process for forming the black matrix. Therefore, the first embodiment of the present disclosure can reduce the number of processes compared to the conventional structure, so that manufacturing time and cost can be reduced, and product yield can be remarkably improved.

In the first embodiment of the present disclosure, unlike the conventional structure in which the Evss wiring EVL is formed on the thin film transistor array substrate, it is not necessary to separately allocate a connection area of the Evss wiring EVL and the cathode CAT within one pixel. Therefore, the first embodiment of the present disclosure can be easily applied to a high-resolution display device having a high pixel per inch (PPI), and has an advantage that a degree of design freedom can be remarkably improved.

Second Embodiment

Figure 4:
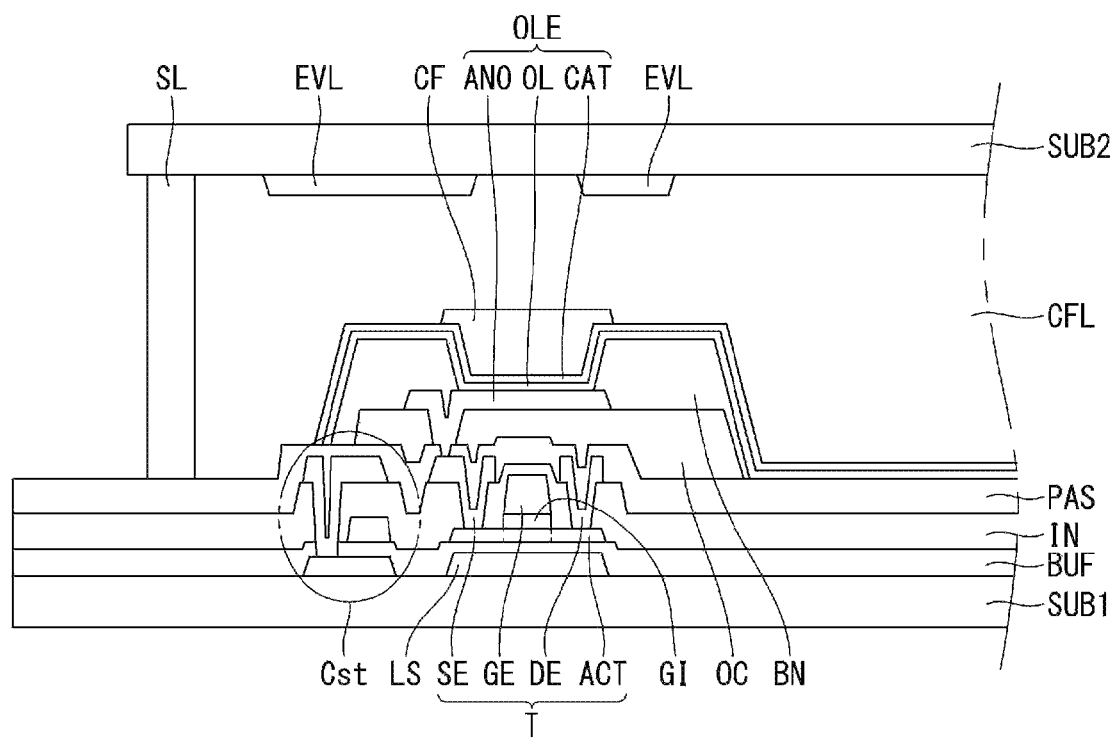
FIG. 4 is a cross-sectional view illustrating an organic light emitting diode display device according to a second embodiment of the present disclosure.

FIG. 4 is a cross-sectional view illustrating an organic light emitting diode display device according to a second embodiment of the present disclosure. In describing the second embodiment, description of the substantially same parts as those of the first embodiment will be omitted.

Referring to FIG. 4, an organic light emitting diode display device according to a second embodiment of the present disclosure includes a display panel having a first substrate SUB1 and a second substrate SUB2 facing each other and a conductive filler layer CFL interposed between the first substrate SUB1 and the second substrate SUB2. The first substrate SUB1 is a thin film transistor array substrate in which a thin film transistor T and an organic light emitting diode OLE connected to the thin film transistor T are formed. The second substrate SUB2 is a substrate on which an Evss wiring EVL is formed.

Unlike the first embodiment, a color filter CF according to the second embodiment is formed on the first substrate SUB1. That is, the thin film transistor T and the organic light emitting diode OLE connected to the thin film transistor T are formed on the first substrate SUB1, and the color filter CF is formed on the organic light emitting diode OLE. The color filter CF is preferably disposed on a cathode CAT constituting the organic light emitting diode OLE. The second embodiment of the present disclosure can reduce a distance between the color filter CF and an organic light emitting layer OL compared with the first embodiment, thus it has an advantage that a viewing angle can be widened and a sufficient aperture ratio can be secured thereby.

Third Embodiment

Figure 5:
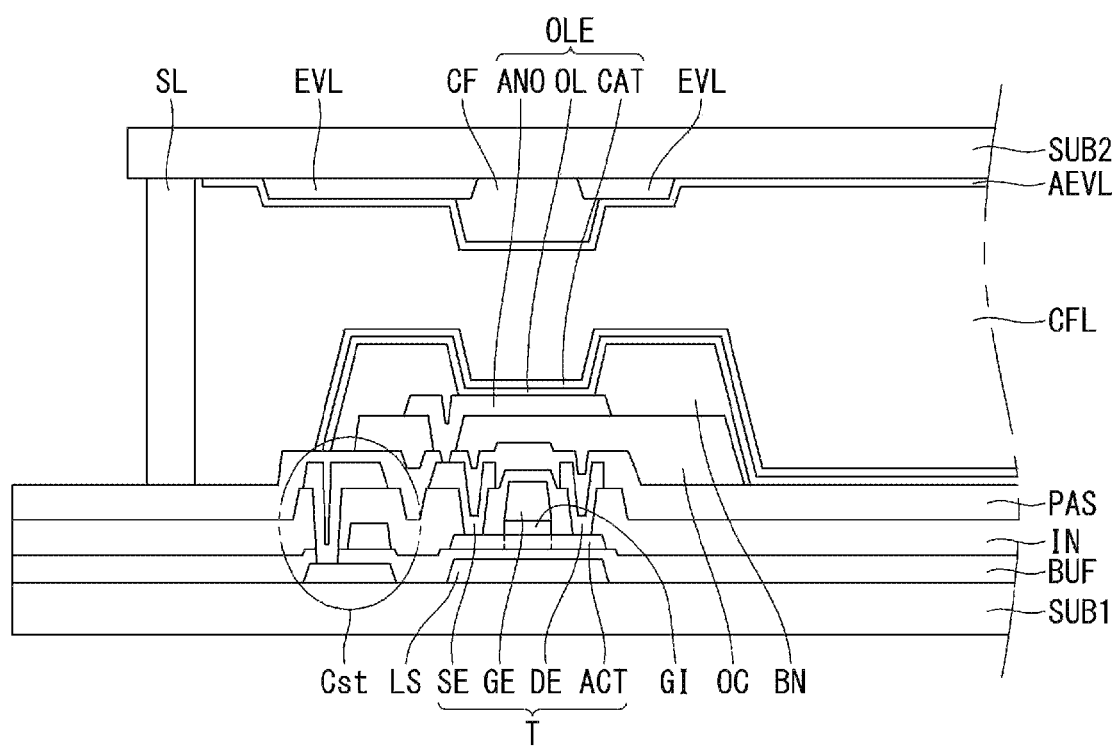
FIG. 5 is a cross-sectional view illustrating an organic light emitting diode display device according to a third embodiment of the present disclosure.

FIG. 5 is a cross-sectional view illustrating an organic light emitting diode display device according to a third embodiment of the present disclosure. In describing the third embodiment, description of the substantially same parts as those of the first embodiment will be omitted.

Referring to FIG. 5, an organic light emitting diode display device according to a third embodiment of the present disclosure includes a display panel having a first substrate SUB1 and a second substrate SUB2 facing each other and a conductive filler layer CFL interposed between the first substrate SUB1 and the second substrate SUB2. The first substrate SUB1 is a thin film transistor array substrate in which a thin film transistor T and an organic light emitting diode OLE connected to the thin film transistor T are formed. The second substrate SUB2 is a substrate on which an Evss wiring EVL is formed.

The Evss wiring EVL and an auxiliary wiring AEVL are formed on the second substrate SUB2. A color filter CF may be positioned on the second substrate SUB2 as in the first embodiment and may be positioned on the first substrate SUB1 as in the second embodiment.

The auxiliary wiring AEVL is in direct contact with the Evss wiring EVL and a conductive filler layer CFL, respectively. For example, in at least one region, an upper surface of the auxiliary wiring AEVL may be in direct contact with the Evss wiring EVL, and an lower surface of the auxiliary wiring AEVL may be in direct contact with a conductive filler layer CFL. The auxiliary wiring AEVL may be formed to have a larger area than the Evss wiring EVL in order to widen the contact area between the Evss wiring EVL and the conductive filler layer CFL. The auxiliary wiring AEVL may be interposed between the Evss wiring EVL and the conductive filler layer CFL. The auxiliary wiring AEVL may be formed to cover the Evss wiring EVL and the color filter CF, and may be formed widely on an entire surface of the second substrate SUB2 including a light emitting area. The auxiliary wiring AEVL may be formed of a transparent conductive material such as Indium Tin Oxide (ITO) and Indium Zinc Oxide (IZO).

Since the third embodiment of the present disclosure can secure a sufficient contact area between the Evss wiring EVL and the cathode CAT by using the auxiliary wiring AEVL, it is possible to minimize contact failure between the Evss wiring EVL and the cathode CAT. Since the third embodiment of the present disclosure can more effectively reduce voltage deviation depending on a position, it is possible to minimize non-uniformity in luminance.

Fourth Embodiment

Figure 6A:
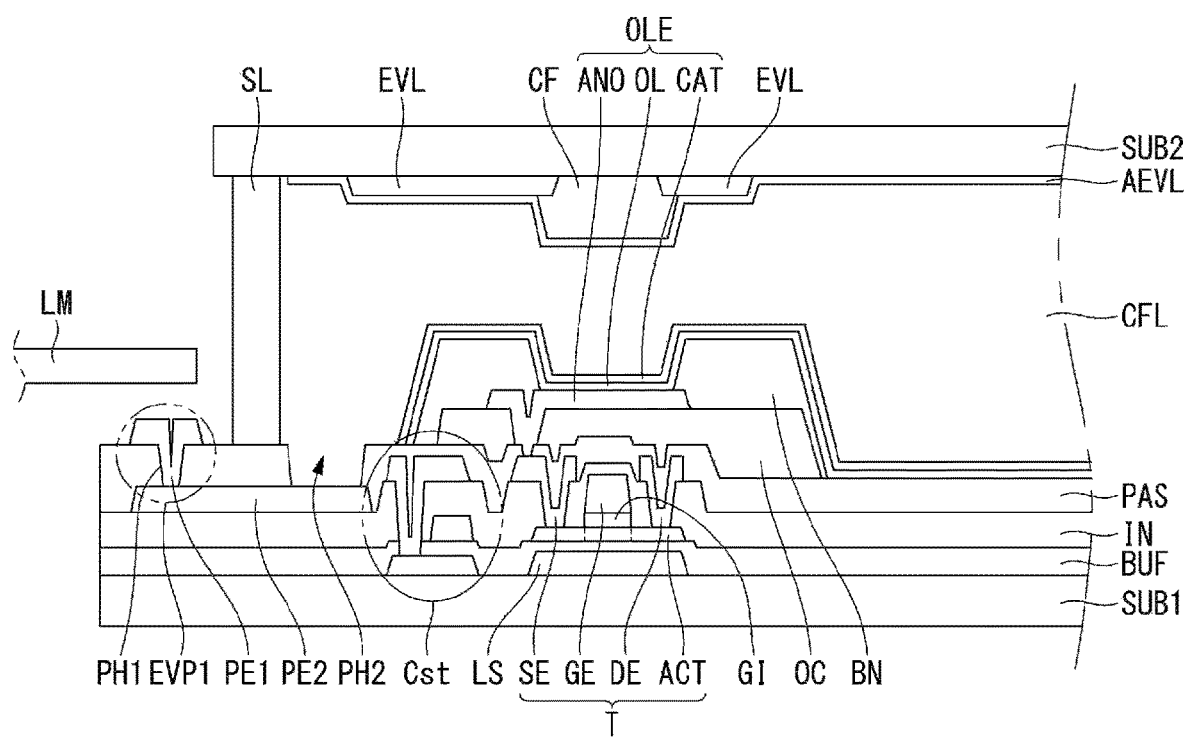
FIGS. 6A and 6B are cross-sectional views illustrating an organic light emitting diode display device according to a fourth embodiment of the present disclosure.
Figure 6B:
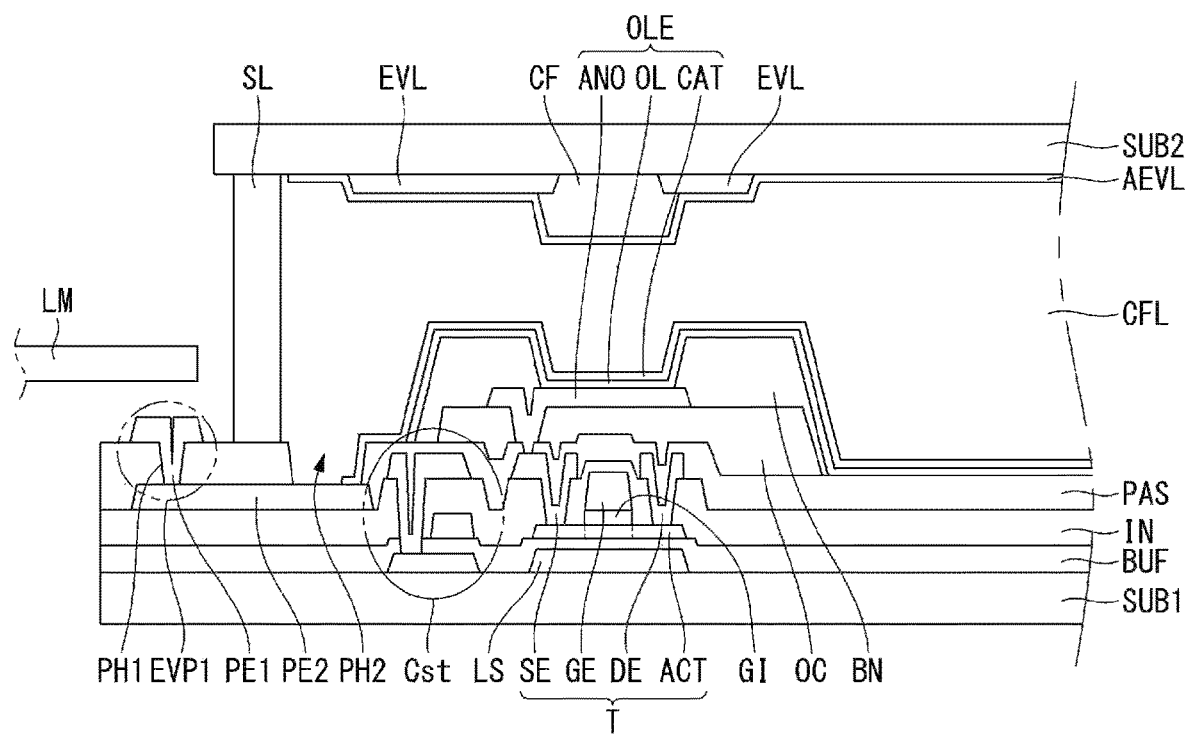

FIGS. 6A and 6B are cross-sectional views illustrating an organic light emitting diode display device according to a fourth embodiment of the present disclosure. In describing the fourth embodiment, description of the substantially same parts as those of the first embodiment will be omitted.

Referring to FIG. 6A, an organic light emitting diode display device according to a fourth embodiment of the present disclosure includes a display panel and a link member LM attached to the display panel. The display panel has a first substrate SUB1 and a second substrate SUB2 facing each other and a conductive filler layer CFL interposed between the first substrate SUB1 and the second substrate SUB2. The first substrate SUB1 is a thin film transistor array substrate in which a thin film transistor T and an organic light emitting diode OLE connected to the thin film transistor T are formed. The second substrate SUB2 is a substrate on which an Evss wiring EVL is formed.

The first substrate SUB1 includes an Evss pad part EVP1 (or a low level power pad part). The Evss pad part EVP1 is electrically connected to the link member LM. The Evss pad part EVP1 receives a low level power supply voltage generated from a power generator (not shown) through the link member LM and transmits it to the conductive filler layer CFL. That is, the link member LM, the Evss pad part EVP1, the conductive filler layer CFL, the Evss wiring EVL, and the cathode CAT are electrically connected to form a low level power supply path.

More specifically, the Evss pad part EVP1 includes at least one pad electrode. When there are a plurality of pad electrodes, the pad electrodes may be disposed in different layers with at least one insulating layer interposed therebetween, and may be electrically connected through pad contact holes passing through the at least one insulating layer. For example, as shown in the figure, the Evss pad part EVP1 may include a first pad electrode PE1 and a second pad electrode PE2 disposed on different layers with a passivation layer PAS therebetween, and the first pad electrode PE1 and the second pad electrode PE2 may be interconnected through a first pad contact hole PH1 passing through the passivation layer PAS. Hereinafter, for convenience of explanation, it will be described a case where the Evss pad part EVP1 includes the first pad electrode PE1 and the second pad electrode PE2 as an example.

The first pad electrode PE1 may extend outside a sealant SL and be exposed to outside. The exposed first pad electrode PE1 may be bonded to the link member LM. The link member LM and the first pad electrode PE1 may be bonded to each other through an anisotropic conductive film (ACF) layer (not shown) interposed therebetween. The link member LM may be a chip on film (COF), but is not limited thereto.

The second pad electrode PE2 may extend inside the sealant SL and be in contact with the conductive filler layer CFL. At this time, the second pad electrode PE2 may be in contact with the conductive filler layer CFL through a second contact hole PH2 passing through the passivation layer PAS. Thereby, the link member LM, the Evss pad part EVP1, the conductive filler layer CFL, the Evss wiring EVL, and the cathode CAT are electrically connected to form a low level power supply path.

Referring to FIG. 6B, the Evss pad part EVP1 can directly transmit the low level power supply voltage to the conductive filler layer CFL and also to the cathode CAT. For example, the second pad electrode PE2 may be in direct contact with the conductive filler layer CFL through the second contact hole PH2, and also may be in direct contact with the cathode CAT. In this case, there is an advantage that a more stable power supply can be provided compared with the structure of FIG. 6A.

Fifth Embodiment

Figure 7:
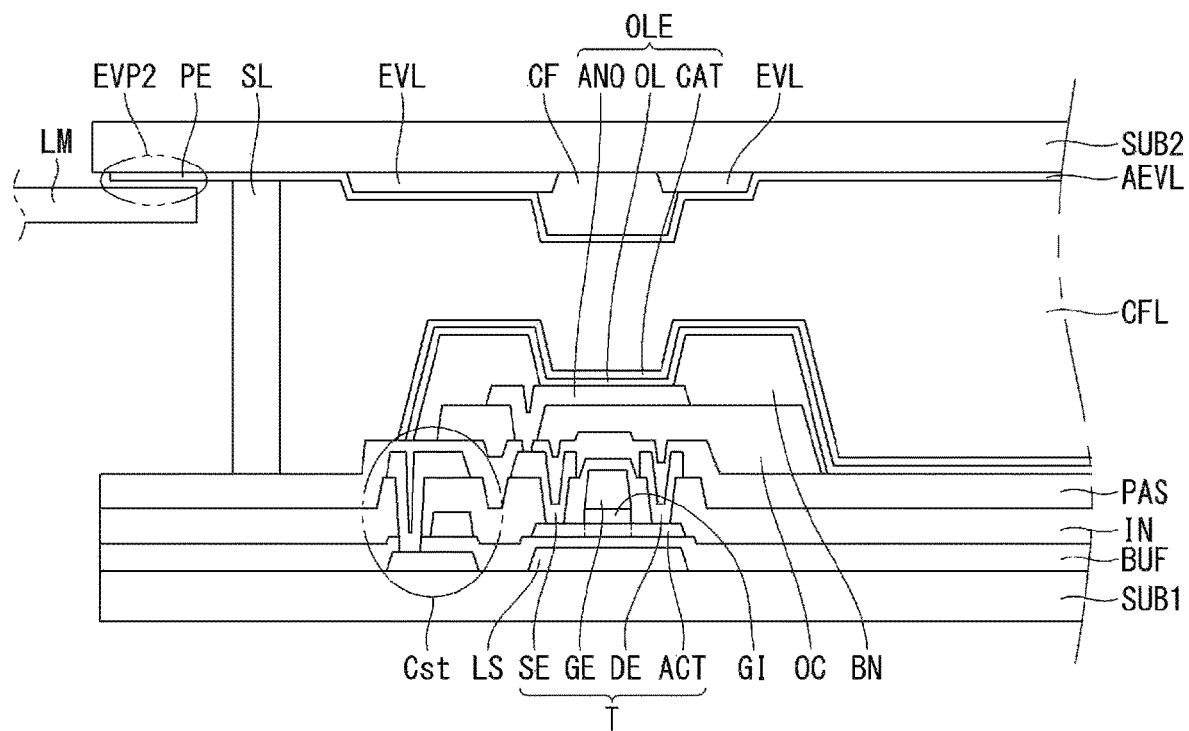
FIG. 7 is a cross-sectional view illustrating an organic light emitting diode display device according to a fifth embodiment of the present disclosure.

FIG. 7 is a cross-sectional view illustrating an organic light emitting diode display device according to a fifth embodiment of the present disclosure. In describing the fifth embodiment, description of the substantially same parts as those of the first embodiment will be omitted.

Referring to FIG. 7, an organic light emitting diode display device according to a fifth embodiment of the present disclosure includes a display panel and a link member LM attached to the display panel. The display panel has a first substrate SUB1 and a second substrate SUB2 facing each other and a conductive filler layer CFL interposed between the first substrate SUB1 and the second substrate SUB2. The first substrate SUB1 is a thin film transistor array substrate in which a thin film transistor T and an organic light emitting diode OLE connected to the thin film transistor T are formed. The second substrate SUB2 is a substrate on which an Evss wiring EVL is formed.

The second substrate SUB2 includes an Evss pad part EVP2. The Evss pad part EVP2 is electrically connected to the link member LM. The Evss pad part EVP2 receives a low level power supply voltage generated from a power generator (not shown) through the link member LM and transmits it to the Evss wiring EVL. That is, the link member LM, the Evss pad part EVP2, the Evss wiring EVL, the conductive filler layer CFL, and a cathode CAT are electrically connected to form a low level power supply path.

The Evss pad part EVP2 includes at least one pad electrode PE. The pad electrode PE may be a portion of an auxiliary wiring AEVL. That is, the auxiliary wiring AEVL may contact the Evss wiring EVL inside a sealant SL, and may extend outside the sealant SL. Here, the extended portion of the auxiliary wiring AEVL may be referred to as the pad electrode PE. The link member LM and the pad electrode PE can be bonded to each other through an anisotropic conductive film (ACF) layer interposed therebetween. The link member LM may be a chip on film (COF), but is not limited thereto.

The auxiliary wiring AEVL is in direct contact with the Evss wiring EVL and the conductive filler layer CFL, respectively. The auxiliary wiring AEVL may be formed to have a larger area than the Evss wiring EVL in order to widen the contact area between the Evss wiring EVL and the conductive filler layer CFL. The auxiliary wiring AEVL may be interposed between the Evss wiring EVL and the conductive filler layer CFL. The auxiliary wiring AEVL may be formed to cover the Evss wiring EVL and the color filter CF, and may be formed widely on an entire surface of the second substrate SUB2 including a light emitting area. The auxiliary wiring AEVL may be formed of a transparent conductive material such as Indium Tin Oxide (ITO) and Indium Zinc Oxide (IZO).

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting diode display device comprising:
   a first substrate having a plurality of pixels in which a thin film transistor and an organic light emitting diode connected to the thin film transistor are arranged;
   a second substrate having a power supply wiring to which a power supply voltage is applied; and
   a conductive filler layer interposed between the first substrate and the second substrate and having a conductive medium, a cathode of the organic light emitting diode and the power supply wiring electrically connected through the conductive filler layer, and the second substrate including an auxiliary wiring which is in direct contact with the power supply wiring and the conductive filler layer, respectively.

2. The organic light emitting diode display device of claim 1, wherein the first substrate and the second substrate include a light emitting area in which the pixels are disposed and a non-light emitting area outside the light emitting area, and
   wherein the power supply wiring is disposed in the non-light emitting area.

3. The organic light emitting diode display device of claim 2, wherein the auxiliary wiring includes a transparent conductive material.

4. The organic light emitting diode display device of claim 1, wherein the auxiliary wiring has a larger area than the power supply wiring.

5. The organic light emitting diode display device of claim 1, wherein the second substrate further comprises color filters assigned corresponding to each of the pixels, and
   wherein the color filters are partitioned by the power supply wiring.

6. The organic light emitting diode display device of claim 1, wherein the first substrate further comprises color filters assigned corresponding to each of the pixels, and
   wherein the color filters are disposed on the cathode.

7. The organic light emitting diode display device of claim 1, further comprising:
   a link member attached to at least one side of the first substrate, wherein the first substrate comprises a power supply pad part which is connected to the link member, and receives the power supply voltage through the link member and transmits the power supply voltage to the conductive filler layer.

8. The organic light emitting diode display device of claim 7, wherein the power supply pad part is in direct contact with the cathode.

9. The organic light emitting diode display device of claim 1, further comprising:
a link member attached to at least one side of the second substrate,
wherein the second substrate comprises a power supply pad part which is connected to the link member and receives the power supply voltage through the link member and transmits the power supply voltage to the power supply wiring.

10. The organic light emitting diode display device of claim 9, wherein the power supply pad part includes a pad electrode connected to the link member, and
wherein the pad electrode is in direct contact with the power supply wiring and the conductive filler layer, respectively, and includes a transparent conductive material.

11. The organic light emitting diode display device of claim 1, wherein the power supply wiring includes a low reflective material.

12. The organic light emitting diode display device of claim 1, wherein the conductive filler layer comprises at least one of a conductive poly (3,4-ethylenedioxythiophene) (PEDOT) and an ionic liquid.

13. An organic light emitting diode display device, comprising:
a first substrate having a plurality of pixels in which a thin film transistor and an organic light emitting diode connected to the thin film transistor are arranged;
a second substrate including a power supply wiring configured to receive a power supply voltage, the power supply wiring further configured to function as a black matrix of the organic light emitting diode display device; and
a conductive filler layer interposed between the first substrate and the second substrate and having a conductive medium, a cathode of the organic light emitting diode and the power supply wiring electrically connected through the conductive filler layer.

14. The organic light emitting diode display device of claim 13, wherein the power supply wiring comprises a low-reflection conductive material.

15. The organic light emitting diode display device of claim 13, wherein the second substrate further comprises an auxiliary wiring in direct contact with the power supply wiring and the conductive filler layer.

16. The organic light emitting diode display device of claim 15, wherein the auxiliary winding layer is configured to have an area in contact with the conductive filler layer that is larger than an area of the power supply wiring.

17. The organic light emitting diode display device of claim 13, wherein the first substrate further comprises a power supply pad part coupled to the conductive filler layer and configured to be coupled to a link member to receive a power supply voltage.

18. An organic light emitting diode display device, comprising:
a first substrate having a plurality of pixels in which a thin film transistor and an organic light emitting diode connected to the thin film transistor, the organic light emitting diode including a cathode and the first substrate further including at least one pad electrode configured to receive a power supply voltage;
a second substrate including a power supply wiring layer configured to receive a power supply voltage, the second substrate further including an auxiliary wiring layer in direct contact with the power supply wiring layer; and
a conductive filler layer between the cathode of the organic light emitting diode and the auxiliary wiring layer to electrically connect the cathode and the auxiliary wiring layer, and the conductive filler layer being in direct contact with the at least one pad electrode.

19. The organic light emitting diode display device of claim 18, further comprising a sealant disposed at edges of the first substrate and the second substrate to bond the first substrate and second substrate.

20. The organic light emitting diode display device of claim 19, wherein the at least one pad electrode comprises:
a first pad electrode disposed outside an encapsulation region formed between the first substrate and second substrate by the sealant; and
a second pad electrode in direct contact with the first pad electrode and the conductive filler layer, the second pad electrode disposed inside the encapsulation region.

21. The organic light emitting diode display device of claim 20, wherein the second pad electrode is in direct contact with the cathode.

* * * * *